United States Patent
Channey et al.

(10) Patent No.: US 10,901,609 B2
(45) Date of Patent: Jan. 26, 2021

(54) SURFACE WRAPPED USER INTERFACE TOUCH CONTROL

(71) Applicant: Harman International Industries, Incorporated, Stamford, CT (US)

(72) Inventors: Royce D. Channey, Ann Arbor, MI (US); Rashmi Rao, West Bloomfield, MI (US); Jason Cummins, Detroit, MI (US); Daren Harris, Gilbert, AZ (US)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 0 days.

(21) Appl. No.: 16/216,465

(22) Filed: Dec. 11, 2018

(65) Prior Publication Data

US 2019/0179527 A1 Jun. 13, 2019

Related U.S. Application Data

(60) Provisional application No. 62/597,931, filed on Dec. 12, 2017.

(51) Int. Cl.
*B60K 37/00* (2006.01)
*G06F 3/0488* (2013.01)
(Continued)

(52) U.S. Cl.
CPC .......... *G06F 3/04883* (2013.01); *B60K 37/00* (2013.01); *B60K 37/06* (2013.01);
(Continued)

(58) Field of Classification Search
CPC .. G06F 3/04883; G06F 3/0416; G06F 3/0412; G06F 3/04847; G06F 3/0488;
(Continued)

(56) References Cited

U.S. PATENT DOCUMENTS

2002/0101738 A1* 8/2002 Misaras .................. B60Q 3/14
362/487
2009/0058118 A1 3/2009 Hein et al.
(Continued)

FOREIGN PATENT DOCUMENTS

EP 3372437 3/2009
EP 2208645 7/2010

OTHER PUBLICATIONS

Supplementary European Search Report and the European Search Opinion dated Feb. 25, 2019 From the European Patent Office Re. Application No. 18211819.0. (8 Pages).

*Primary Examiner* — Rodney Amadiz
(74) *Attorney, Agent, or Firm* — McCoy Russell LLP

(57) ABSTRACT

The present disclosure relates to touch control devices and surface wrapped control interfaces for vehicles. In one embodiment, a touch control device includes a housing assembly including an outer surface, and a touch sensor mounted to an inner surface of the housing assembly. The touch sensor includes at least one touch zone and is configured to detect contact to the outer surface of the housing assembly associated with the at least one touch zone. The touch control device may also include at least one illumination element to illuminate a portion of the outer surface of the housing assembly associated the at least one touch zone and a controller configured to illuminate at least one illumination element in response to contact with the a touch zone. The touch control device can output a control signal in response to contact with the at least one touch zone.

20 Claims, 4 Drawing Sheets

(51) Int. Cl.
*G06F 3/041* (2006.01)
*B60K 37/06* (2006.01)
*H03K 17/96* (2006.01)

(52) U.S. Cl.
CPC .......... *G06F 3/0412* (2013.01); *G06F 3/0416* (2013.01); *H03K 17/962* (2013.01); *B60K 2370/336* (2019.05); *B60K 2370/339* (2019.05); *B60K 2370/34* (2019.05); *B60K 2370/345* (2019.05); *B60K 2370/688* (2019.05)

(58) Field of Classification Search
CPC ...... H03K 17/962; B60K 37/06; B60K 37/00; B60K 2370/336; B60K 2370/688; B60K 2370/339; B60K 2370/34; B60K 2370/345
See application file for complete search history.

(56) References Cited

U.S. PATENT DOCUMENTS

| | | | |
|---|---|---|---|
| 2011/0002138 A1* | 1/2011 | Hayes | B60Q 3/54 362/551 |
| 2015/0210226 A1* | 7/2015 | Topart | B60Q 3/54 362/511 |
| 2015/0279523 A1* | 10/2015 | Oeuvrard | B60K 37/00 338/47 |

* cited by examiner

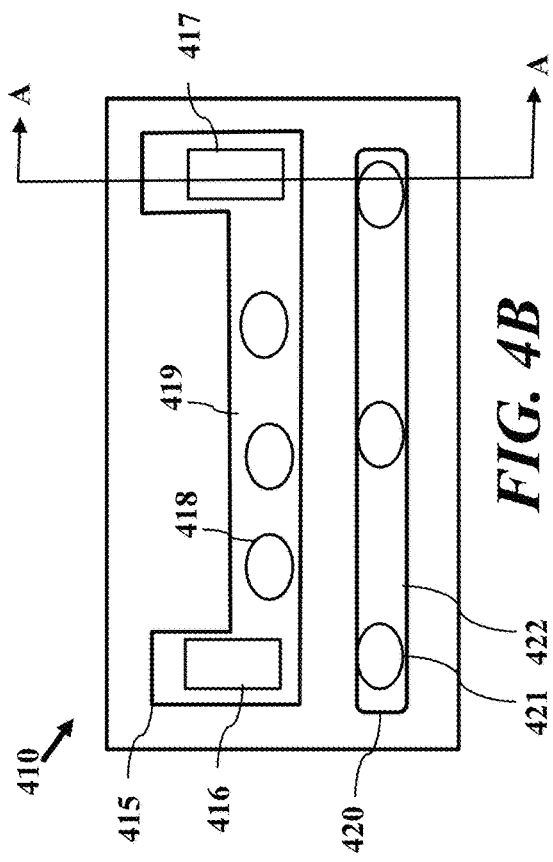
FIG. 4B
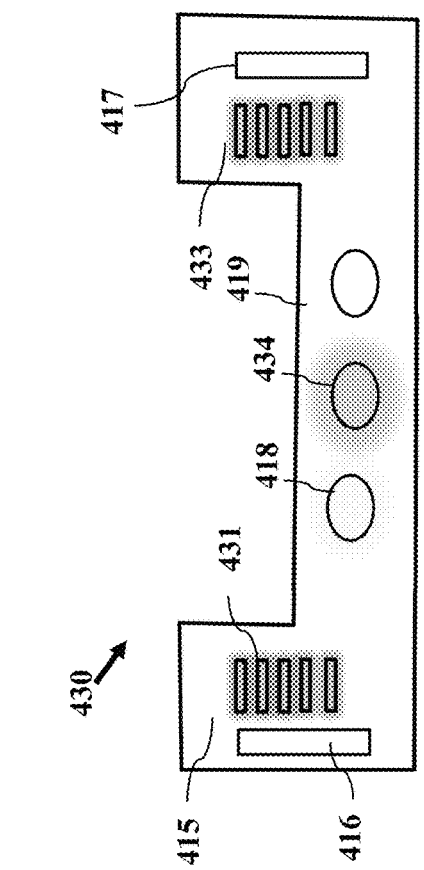
FIG. 4D
FIG. 4A
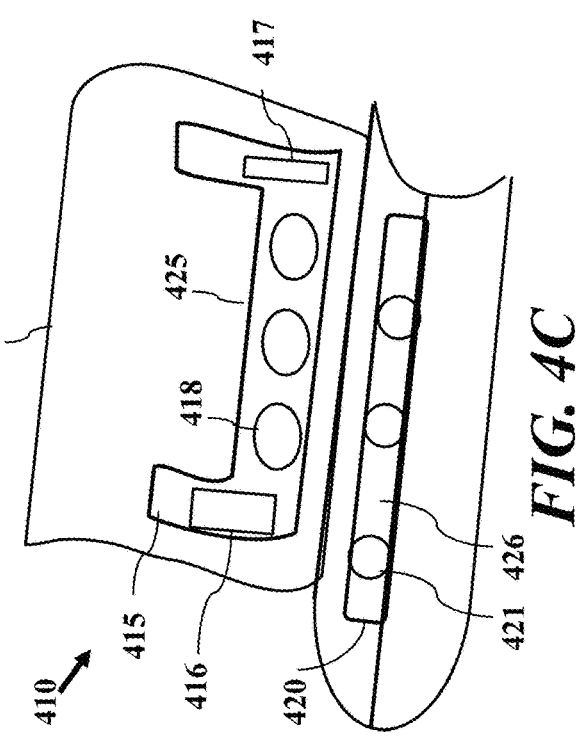
FIG. 4C

SURFACE WRAPPED USER INTERFACE TOUCH CONTROL

CROSS-REFERENCE TO RELATED APPLICATION

This application claims priority to U.S. Provisional Application No. 62/597,931 filed on Dec. 12, 2017 and titled SURFACE WRAPPED USER INTERFACE TOUCH CONTROL, the content of which is expressly incorporated by reference in its entirety.

FIELD

The present disclosure relates to user interface control elements, and more particularly to a surface wrapped user interface touch control and methods of using same.

BACKGROUND

Modern devices use a variety of control means to detect operational commands. There exists a need to improve upon the conventional control interface elements, such as simple push buttons and control knobs. In some cases for example, the structure of conventional units impose structural requirements on a device. By way of further example, conventional push button switches may require an elevated or silo structure to allow for the button to be pressed. In many cases, the structure of the conventional buttons do not allow for the buttons or input elements to be covered or wrapped by other materials. Typical push button elements are accompanied by a label or symbol identifying operation of the button.

Product designers are often faced with the task of designing control interfaces with a particular appearance. Often, new designs require advances in technology and component design to accommodate desired interface details. In the automotive industry, for example, many manufacturers develop new control interface layouts with new models and model refreshes. Due to one or more considerations, such as spacing, layout and weight, existing control interfaces do not meet the requirements of new designs. In many cases, changing size and shape of conventional buttons does not allow for the desired interface. In addition, functions of control interfaces change with advances in vehicle technology and function. There exists a desire for control interface elements that allows for use in a vehicle control interfaces and for device interfaces in general.

SUMMARY

Disclosed and claimed herein are methods, configurations and devices for touch control. One embodiment is directed to a touch control device including a housing assembly including an outer surface, and a touch sensor mounted to an inner surface of the housing assembly. The touch sensor includes at least one touch zone and the touch sensor is configured to detect contact to the outer surface of the housing assembly associated with the at least one touch zone. The touch control device also includes at least one illumination element configured to illuminate a portion of the outer surface of the housing assembly associated with the at least one touch zone. The touch control device also includes a controller coupled to the touch sensor and the at least one illumination element. The controller is configured to illuminate the at least one illumination element in response to contact with the at least one touch zone, and output a control signal in response to contact with the at least one touch zone.

In one embodiment, the outer surface is a flat surface.

In one embodiment, the outer surface is a curved surface.

In one embodiment, the housing assembly mounts to a main panel and the touch control device and main panel are wrapped in a material.

In one embodiment, the touch sensor includes a plurality of touch zones.

In one embodiment, the illumination element includes at least one light source and at least one illumination area of the surface.

In one embodiment, the controller is mounted to the housing assembly and is configured to output touch commands detected by the touch sensor.

In one embodiment, the touch sensor includes at least one illumination element for each of the plurality of touch zones.

In one embodiment, the touch sensor includes a light tube for each touch zone, wherein the light tube is configured to be illuminated and controlled to present one or more colors by the controller.

One embodiment is directed to a method for operation of a touch control including detecting, by a touch control, an input to at least one touch zone of the touch control, wherein the input includes contact to a wrapped surface of the touch control. The method also includes controlling, by a controller of the touch control, illumination of at least one illumination element of the touch control in response to the input, and outputting, by a controller of the touch control, a control signal in response to contact with the at least one touch zone.

In one embodiment, the method includes illuminating at least one touch zone to signal the location of one or more touch zones of the touch control.

In one embodiment, the method includes updating at least one illumination parameters. In certain embodiments, touch zones may be illuminated with a low light level which may be increased in response to a detected input.

One embodiment is directed to a surface wrapped touch control device including a housing assembly supporting an outer surface for a touch control and a touch sensor mounted to an inner surface of the housing assembly. The touch sensor includes at least one touch zone and the touch sensor is configured to detect contact to the outer surface of the housing assembly associated with the at least one touch zone. The surface wrapped touch control device also includes at least one illumination element configured to illuminate a portion of the outer surface of the housing assembly associated the at least one touch zone. The surface wrapped touch control device also includes a wrapping material applied to the outer surface and covering the touch sensor, wherein the wrapping material is configured to be illuminated by the at least one illumination element. The surface wrapped touch control device also includes a controller coupled to the touch sensor and the at least one illumination element, wherein the controller is configured to illuminate the at least one illumination element in response to contact with the at least one touch zone, and output a control signal in response to contact with the at least one touch zone.

In one embodiment, the outer surface is at least one of a flat and curved surface covered by the wrapping material.

In one embodiment, the housing assembly mounts to a main panel and the touch control device and main panel are wrapped in a material.

In one embodiment, the touch sensor includes a plurality of touch zones.

In one embodiment, the illumination element includes at least one light source and at least one illumination area of the surface.

In one embodiment, the controller is mounted to the housing assembly and is configured to output touch commands detected by the touch sensor.

In one embodiment, the touch sensor includes at least one illumination element for each of the plurality of touch zones.

In one embodiment, the touch sensor includes a light tube for each touch zone, wherein the light tube is configured to be illuminated and controlled to present one or more colors by the controller.

Other aspects, features, and techniques will be apparent to one skilled in the relevant art in view of the following detailed description of the embodiments.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein:

FIG. 4A depicts a graphical representation of a vehicle configuration including a control interface according to one or more embodiments;

FIG. 4B depicts a graphical representation of a control interface configuration according to one or more embodiments;

FIG. 4C depicts a graphical representation of a control interface configuration according to another embodiment;

FIG. 4D depicts a graphical representation of a control interface configuration according to another embodiment;

DETAILED DESCRIPTION OF THE EXEMPLARY EMBODIMENTS

Overview and Terminology

Figure 1:
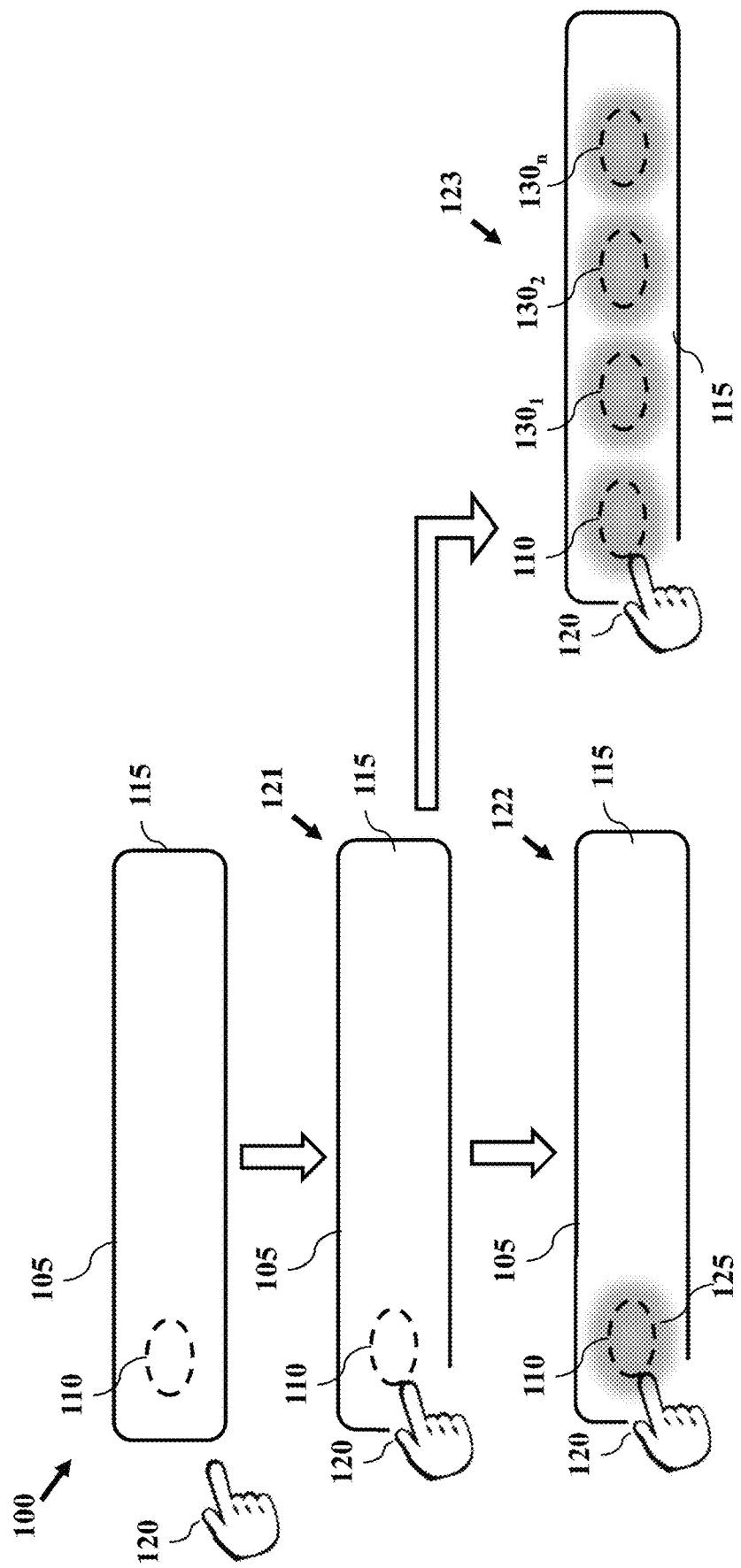
FIG. 1 depicts operation of a user interface control according to one or more embodiments.

One aspect of the disclosure is directed to user interface touch controls and operation. In one embodiment, a surface wrapped touch control is provided including a material wrapping a surface and covering one or more sensing zones. The touch control is configured to illuminate one or more portions of the surface. The touch control is configured to provide one or more of a touch detection and slider operation. In that fashion, zones of the touch control may be contacted and operate as input elements. At least one of the touch sensing, illumination, and touch control structure are configured to allow for a material to wrap a surface of the touch control. Configurations and devices described herein may relate to flat and curved surfaces.

One embodiment is directed to an assembly for a vehicle. In another embodiment, vehicle configurations are provided including one or more surfaces having at least one touch zone. The one or more assemblies of the touch control may be associated with a plurality of vehicle surfaces. The touch control assemblies may also be controlled to allow for control of vehicle units, such as climate control inputs and functions of a vehicle head unit (e.g., infotainment unit, navigation, unit, user interface display, etc.).

Embodiments are also directed to operation and control of user interface touch controls. By way of example, one or more illumination settings may be controlled to provide a feedback to a user. In addition, illumination settings and configurations of the touch control allow for a surface of the touch control to appear as a smooth surface while also allowing for contact with one or more touch zones. Illumination of the surface can provide notifications of detected contact. Embodiments and configurations discussed herein provide can allow for maintaining uninterrupted design while providing functional accessibility to common controls.

Although device configurations are discussed herein with respect to vehicle control and vehicle applications, it should be appreciated that touch control units may be applied to other devices and for additional applications.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment," "certain embodiments," "an embodiment," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation.

Exemplary Embodiments

FIG. 1 depicts operation of a user interface control according to one or more embodiments. According to one embodiment, a touch control device is provided including a surface and one or more elements to detect contact with the surface. Embodiments are also directed to operation and control of user interface touch controls. By way of example, one or more illumination settings may be controlled to provide a feedback to a user. In addition, illumination settings and configurations of the touch control allow for a surface of the touch control to appear as a smooth surface while also allowing for contact with one or more touch zones. Illumination of the surface can provide notifications of detected contact. Embodiments and configurations discussed herein provide can allow for maintaining uninterrupted design while providing functional accessibility to common controls.

Touch control 100 may be a surface wrapped touch control including a material wrapping an outer surface 105 of the touch control and covering one or more sensing zones. Touch control 100 may be configured to illuminate one or more portions of surface 105. Touch control 100 may also provide one or more of a touch detection and slider operation. In that fashion, zones of touch control 100 may be contacted and operate as input elements. At least one of the touch sensing, illumination, and touch control structure are configured to allow for a material to wrap a surface of the touch control. Configurations and devices described herein may relate to flat and curved surfaces.

In one embodiment, contact with zones or particular touch zones of the surface may be detected by touch sensors mounted within the touch control device. Touch control 100 includes surface 105 and at least one touch zone shown as 110 in FIG. 1. According to one embodiment of the disclosure, touch control 100 includes a touch sensor (e.g., film touch sensor, capacitive touch sensor, flexible touch sensor, etc.) having at least one touch zone and one or more structural elements such as a sub-bezel or housing providing an outer surface. The touch sensor of touch control 100 may be mounted to an inner surface of the housing assembly. In that fashion, the touch sensor is configured to detect contact to the outer surface of the housing assembly associated with the at least one touch zone. In certain embodiments, touch control 100 may include a housing assembly or sub bezel holding a sheet or formed material, wherein the touch sensor is mounted to an inner surface of the sheet material. The housing and sensor of touch control 100 allow for a user interface that detects touch but does not require buttons or other control inputs mounted to the outside of the housing. In that fashion, touch control 100 may be wrapped in a material that allows for the inputs to appear as part of the surface of the interface. In certain embodiments, the wrapped material may be etched or embossed to indicate touch zones and/or functionalities associated with the touch zone. By way of example, a touch zone associated with climate control for a vehicle may include an up arrow, down arrow and letters "TEMP" such that location of the up and down arrows is associated with touch zones. The actual touch zones of the touch sensor may be hidden from view allowing for the housing material to protect the sensor. In addition to protections the sensor, the configurations descried herein allow for curved surfaces to be utilized as input surfaces.

In one embodiment, the housing assembly of touch control 100 provides an outer surface that may be wrapped, wherein contact to the outer surface and/or wrapped outer surface may be detected. The housing assembly of touch control 100 may mount to a main panel and the touch control device and the main panel may both be wrapped in a material. The outer surface is shown as surface 105 in FIG. 1, which may include one or more touch zones. Surface 105 may be part of a housing assembly associated with touch control 100. In one embodiment, surface 105 of touch control 100 may be a flat surface. In one embodiment, surface 105 of touch control 100 may be a curved surface.

According to one embodiment, touch control 100 includes at least one illumination element configured to illuminate a portion of the outer surface of the housing assembly associated at least one touch zone. Touch control 100 may also include a controller coupled to the touch sensor and the at least one illumination element. The controller may be configured to illuminate the at least one illumination element in response to contact with the at least one touch zone. The controller may also be configured to output a control signal in response to contact with the at least one touch zone.

According to one embodiment, surface 105 may be illuminated to one or more states, ranging from no illumination to illumination of all elements of surface 105. State 115 is depicted where no elements are illuminated. A user input is shown by 120, making contact with touch zone 110 represented as state 121.

Touch control 100 may configured to detect contact from user 120, as shown by state 121. In response to the contact, touch control 100 may perform one or more operations. In one embodiment, touch control 100 may illuminate a portion of surface 105. In state 122, glow 125 is emitted. Glow 125 may be from behind a wrapped material of surface 105 of touch control 100. Glow 125 shows illumination output by touch control 100.

Following state 121, touch control 100 may be configured to detect contact from user 120, as shown by state 123. In response to the contact, touch control 100 may perform one or more operations including illumination of all touch zones including touch zones $130_{1-n}$. The touch sensor of touch control 100 can include at least one illumination element for each of the plurality of touch zones $130_{1-n}$ and touch zone 110. By way of further example, touch control 100 may include a light tube for each of touch zone 110 and touch zones $130_{1-n}$. Each of the light tubes can be configured to be illuminated and controlled to present one or more colors by the controller. In one embodiment, illumination of all touch zones may be in response to vehicle start up or other vehicle events such as activation of vehicle head lamps.

Touch control 100 allows for a surface that can accommodate vehicle and other device constraints such as a flat or curved surface without requiring a conventional pushbutton switch. As will be discussed herein, the configurations allow for detection and feedback through illumination of contact with input terminals. The configurations allow for input terminals without physical pushbutton presses which move the button into a different position. In contrast, touch control 100 allows for mere contact, such as a touch or tap, to be read as an indication of an input control. Also in contrast to conventional input terminals, touch control 100 does not require for buttons to rise up or be pushed into the structure. As such, touch control 100 described herein are not subject to the buttons which may wear out due to repeated use and button wear.

Figure 2:
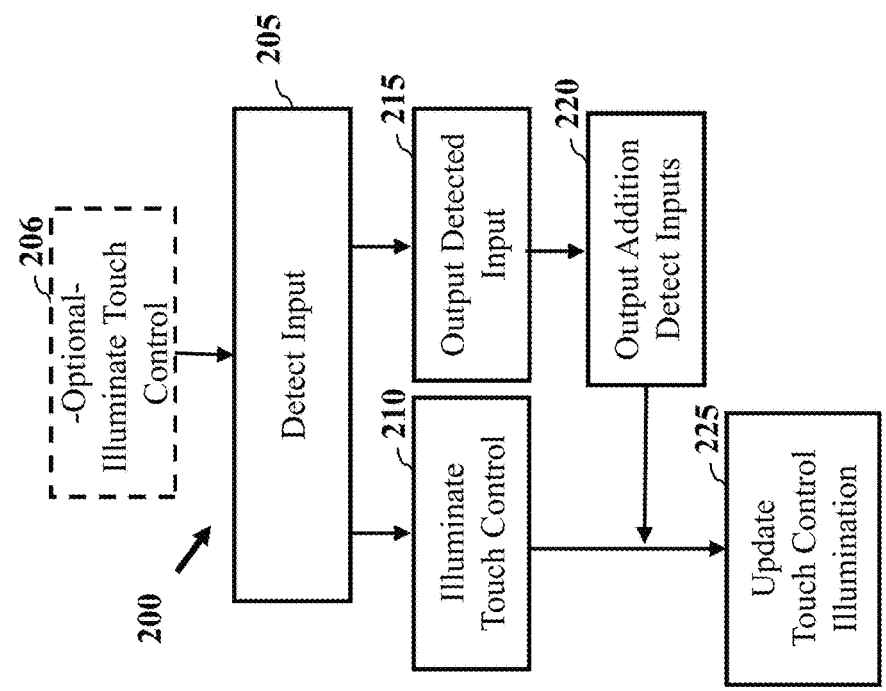
FIG. 2 depicts a process for operation of a touch control according to one or more embodiments.

FIG. 2 depicts a process for operation of a user interface control according to one or more embodiments. Process 200 may be employed for control and operation of device using touch control (e.g., touch control 105). In certain embodiments, process 200 may provide operation of a touch control. Process 200 may be initiated by detecting input to a touch control at block 205. In one embodiment, input to a touch control detected at block 205 may be an input to at least one touch zone of the touch control. The input can include contact to a wrapped surface of the touch control. In certain embodiments, a touch sensor of the touch control detects contact to a wrapped surface of the touch control. The touch sensor may be mounted within a housing assembly of the touch control and detect one or more changes in capacitance, deformation, electrical charging, etc.

In certain embodiments, input at block 205 may be contact may be sliding contact with a surface of the touch control. With respect to vehicle configurations, a sliding contact may adjust temperature or fan speed of a vehicle climate control interface. Alternatively, a sliding control may adjust volume or one or more audio settings. Input at block 205 may be a slide command to control other settings, such as brightness.

Based on the input detected at block 205, a touch control device may be configured to illuminate one or more portions of the touch control. At block 210, a controller of the touch control will then control illumination of at least one illumination element of the touch control in response to the input. At block 215, a controller of the touch control outputs a control signal in response to contact with the at least one touch zone. Illumination at block 210 may be in addition to, and/or independently from, output at block 215.

In certain embodiments, multiple input commands may be detected. For example slider operations, repeated presses, etc. Additional inputs detected may be output at block 220. At block 225 illumination of the touch control may be updated. Illumination may be updated at block 225 based on time, after period of time the light control turns off. In other embodiments, illumination may be updated at block 225 to indicate position of a slide control.

Process 200 may optionally include illuminating touch zones at block 206 to signal the location of one or more touch zones of the touch control. As such, input detected at block 205 may result in updating one or more illumination parameters. Illumination patterns can include one or more of brightness, color, partial/full illumination of illumination sources, output type (e.g., pulse, on, etc.). In certain embodiments, touch zones may be illuminated with a low light level which may be later increased in response to a detected input.

Figure 3:
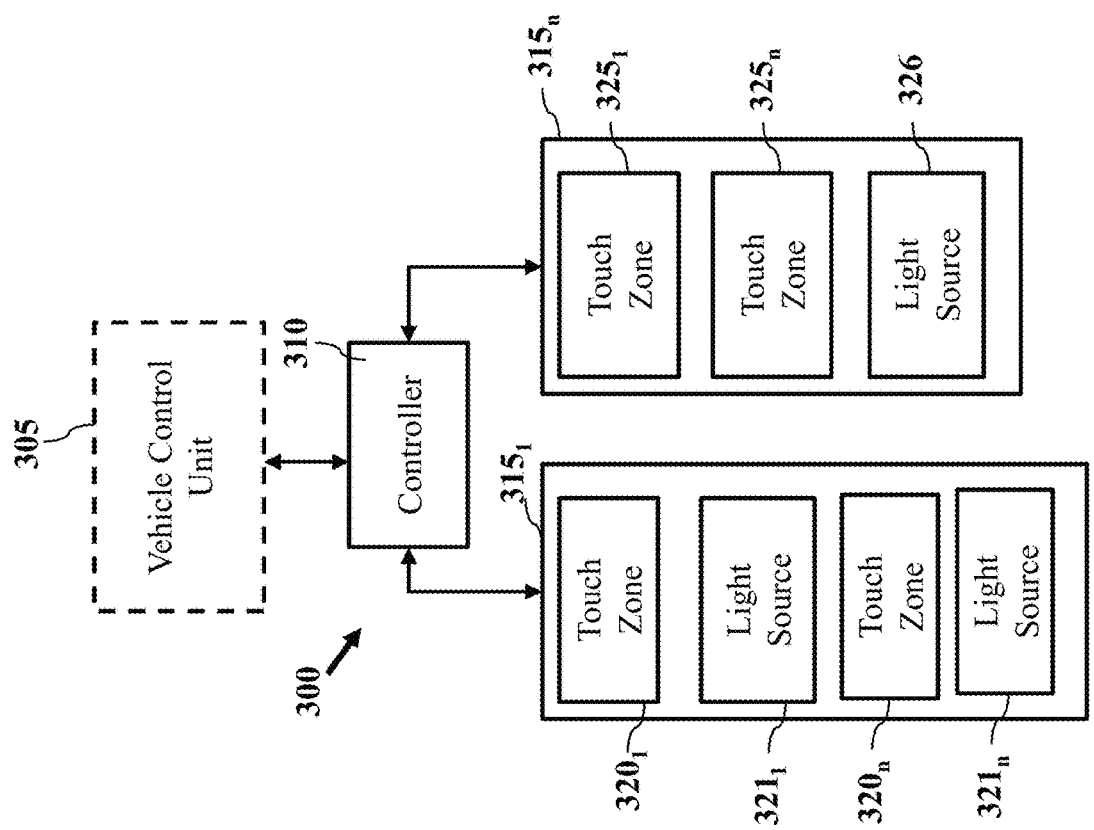
FIG. 3 depicts a graphical representation of a device including touch control inputs according to one or more embodiments.

FIG. 3 depicts a graphical representation of device including touch control inputs according to one or more embodiments. According to one embodiment, device 300 relates to a control interface. Device 300 may optionally interface with a vehicle control unit 305 to provide one or more selections of the control interface. According to one embodiment device 300 includes controller 310 and at least one touch control assembly, such as assemblies $315_{1-n}$. Device 300 may employed as an input interface for a vehicle system, such as climate or infotainment controls of an automobile or passenger vehicle configuration. According to one embodiment, device 300 may provide one or more control inputs for a vehicle infotainment unit such as vehicle control unit 305. Although system 300 and FIG. 3 refers to a vehicle system, it should be appreciated that other control units may be employed. By way example, device 300 may provide input controls for one or more devices in general.

Vehicle control unit 305 may provide one or more of driver assistance, navigation, media, climate control and vehicle control features. In one embodiment, device 300 includes touch control assemblies $315_{1-n}$ which may be used to control one or more functions of device 300. In the vehicle example, may be configured to provide inputs associated with a function of vehicle control unit 305, such as selection of a source (e.g., navigation, climate control, audio settings, media playback, etc.), or control of the source functions. As such, the functions controlled by control assemblies $315_{1-n}$ are soft functions. In other embodiments, control assemblies $315_{1-n}$ may be hard functions configured to provide a particular function for the device. In one exemplary embodiment, control assemblies $315_{1-n}$ may be used to provide climate control inputs. However, it should be appreciated that device 300 and control assemblies $315_{1-n}$ may be configured to provide other functions.

As shown in FIG. 3, control assemblies $315_{1-n}$ are coupled to controller 310. Each control assemblies $315_{1-n}$ may be relate to a particular surface or panel. As such, control assemblies $315_{1-n}$ may be located in different sections of a user interface. Control assemblies $315_{1-n}$ are depicted in FIG. 3 as each including a touch zone and light source. According to one embodiment, each touch zone relates to a touch area of an input touch sensor of control assemblies $315_{1-n}$. In FIG. 3, control assembly $315_1$ includes touch zones $320_{1-n}$ and light sources $321_{1-n}$. Similarly, control assembly $315_n$ includes touch zones $325_{1-n}$ and light source 326. According to one embodiment, light sources of device 300 relate to individual output sources of light, such as a light tube (e.g., guide) that may be illuminated and controlled to present one or more colors. According to one embodiment, each touch zone of touch zones $325_{1-n}$ may be configured to include a light tube. In another embodiment, each light source relates to a multiple element display which may allow for display of a slider control, such as a column of horizontal bar elements that illuminates one or more bars based on slider position.

According to one embodiment, device 300 includes control assemblies $315_{1-n}$ with multiple assembly units and multiple assembly configurations. It should be appreciated that device 300 may include a single control assembly or more than two assemblies. Controller 310 is configured to detect inputs to one or more of control assemblies $315_{1-n}$ and output control signals detected. In certain embodiments, controller 310 may output color or control parameters that may be used by control assemblies $315_{1-n}$ to control color output, activation and other functions.

FIGS. 4A-4D depict graphical representation of touch control assemblies according to one or more embodiments. FIG. 4A depicts a graphical representation of a vehicle configuration including a control interface according to one or more embodiments. Vehicle system 400 relates to an operator's controls for the vehicle including a display unit 405 and control interface 410. FIGS. 4B-4D depict one or more configurations of elements of control interface 410.

Referring now to FIG. 4B, a graphical representation is shown of a configuration of control interface 410 according to one or more embodiments. Control interface 410 relates to an interface that may be employed by vehicle system 400. According to one embodiment, control interface 410 relates to a user interface including one or more surfaces. Configurations are provided herein to allow for multiple services which can address vehicle requirements and spacing and allow for positioning of control inputs in accessible locations. According to one embodiment, each surface includes at least one touch zone. Each surface may be associated with a touch control assembly. Each surface may also be associated with a vehicle surface, such as a section or face of a vehicle control console.

According to one embodiment, control interface 410 includes control assembly 415 and control assembly 420. FIG. 4B depicts control assembly 415 and control assembly 420 in a planar or flat configuration. However, as will be discussed below with respect to FIG. 4C, control assemblies and touch control inputs may be associated with curved surfaces. Control assembly 415 includes a plurality of touch zones, such as tall touch zones 416, 417, and touch zone 418 on surface 419. Control assembly 420 includes a plurality of touch zones, such as touch zone 421, on surface 422. Touch zones of control interface 410 may relate to areas of the interface that may be contacted by a user, wherein the contact is detected when at least a portion of the touch zone is contacted. According to one embodiment, touch zones 418 and 421 may operate similar to a button, wherein contact of the touch zone represents an input. Tall touch zones 416, 417 can relate to slider input wherein contact in a portion of the tall touch zone may indicate a desired level. Similarly, sliding inputs to touch zones 416, 417 or motion may represent a degree or sliding input.

According to one embodiment, touch zones of control interface 410 are shown by shapes associated with an area where touch may be detected. However, according to one embodiment, control interface 410 may include a material covering touch zones and the entire control interface such that surfaces 419 and 422 appear as a surface with no contact elements. In certain embodiments and as described herein, each touch zone of control interface 410 can include one or more light elements that illuminate the touch zone, an area near the touch zone and/or a portion of control interface 410 to indicate an input area. In certain embodiments, the material wrapping control interface 410 may be etched or marked to indicate a touch zone.

According to one embodiment, the touch control assemblies may also be controlled to allow for control of vehicle units, such as climate control inputs and functions of a vehicle head unit (e.g., infotainment unit, navigation, unit, user interface display, etc.). According to one embodiment, tall touch zones 416, 417 may relate to inputs for setting temperature or fan speed of climate controls. Similarly, touch zones of control interface 410, such as touch zones 418 and 421, may be associated with one or more settings of the climate control system. In other embodiment touch zones of control assembly 415 may be associated with climate control features while touch zone 420 may be associated with a different function of a vehicle system.

FIG. 4C depicts a graphical representation of a control interface configuration according to another embodiment. Control interface 410 is shown in FIG. 4C with control assembly 415 and control assembly 420 including a plurality of touch zones and wherein the surface 425 of control assembly 415 and surface 426 of control assembly 420 are associated with a curved surface. Components of control interface 410 allow for control assemblies to be formed with a curved surface and still allow for touch control. In addition to allowing for an aesthetic configuration to be provided, the curved configuration can accommodate vehicle packaging constraints and solves one or more deficiencies associated with requiring larger space for flush or flat mount buttons. In addition to accommodating different vehicle types, touch zones may be provided that allow contact or touch on surfaces that do not support conventional sensors. Control interface 410 includes a plurality of touch zones such as tall touch zones 416, 417, and touch zone 418 on surface 425. Control assembly 420 includes a plurality of touch zones, such as touch zone 421, on surface 426.

FIG. 4D depicts a graphical representation of a control interface configuration according to another embodiment. According to one embodiment, control interface 430 relates to a configuration of control assembly 415 according to one embodiment. Control interface is shown including one or more touch zones illuminated. According to one embodiment, touch zones may be illuminated in response to detection of a user input. According to another embodiment, illumination of touch zones may be activated in response to vehicle events, such as one or more of vehicle startup, shutdown, etc.

Control assembly 415 of control interface 430 includes a plurality of touch zones, such as tall touch zones 416, 417, and touch zones 418, 434 on surface 419. According to one embodiment touch zones of control assembly 415 may each be presented with an illumination element near the location and/or associated with the location of a touch zone. By way of example, tall touch zones 416, 417 are each associated with illumination elements 431, 433 respectively. Illumination elements 431, 433 relate to an arrangement of elements that may be illuminated and appear on the surface 419. According to one embodiment, the color of illumination presented may be based on the function associated with touch zones. Illumination elements 431 output red light associated with a climate control setting (e.g., heat setting), where illumination elements 433 output blue light associated with another climate control setting (e.g., cooling setting). According to one embodiment the number of elements of illumination elements 431 activated may be based on input settings. For example a user contacting a bottom portion of touch zone 416 may only illuminate the first or lower elements of illumination elements 431. Similarly, a full or extended swipe from the bottom toward the top of touch zone 416 may result in all illumination elements 431 being illuminated.

According to one embodiment, touch zones 418, 434 on surface 419 may be illuminated with one or more colors. Touch zone 418 is illuminated with a first configuration (e.g., yellow light, etc.) and touch zone 434 is illuminated with a second configuration (e.g., green light, etc.). In certain embodiments, touch zone elements may all be illuminated the same color. In other embodiments, the color output for each touch zone may change based on function of the control interface, user settings, etc.

FIG. 4D depicts touch zone elements in an illuminated state. According to one embodiment, one or more touch zones may not be readily perceptible in that the surface of the control interface may not identify the touch zones. According to one embodiment, touch zones may remain in a hidden or secret position until activate by a controller (e.g., controller 310). In other embodiments, the touch zones may be activated to illuminate each selectable touch zone. Illumination of touch zones may be based on functions or features associated with a user interface. In certain embodiments, the color or position of a touch zone may be identified in a user interface display, such as display unit 405.

Figure 5B:
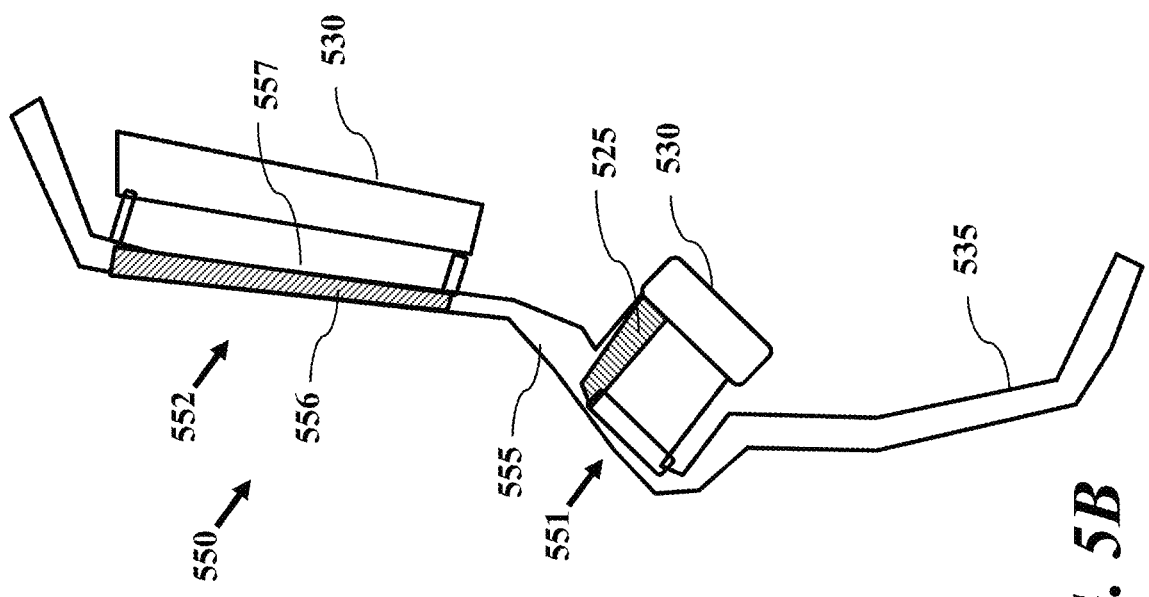
FIG. 5B depicts a graphical representation of a surface wrapped user interface touch control configuration according to one or more embodiments.
Figure 5A:
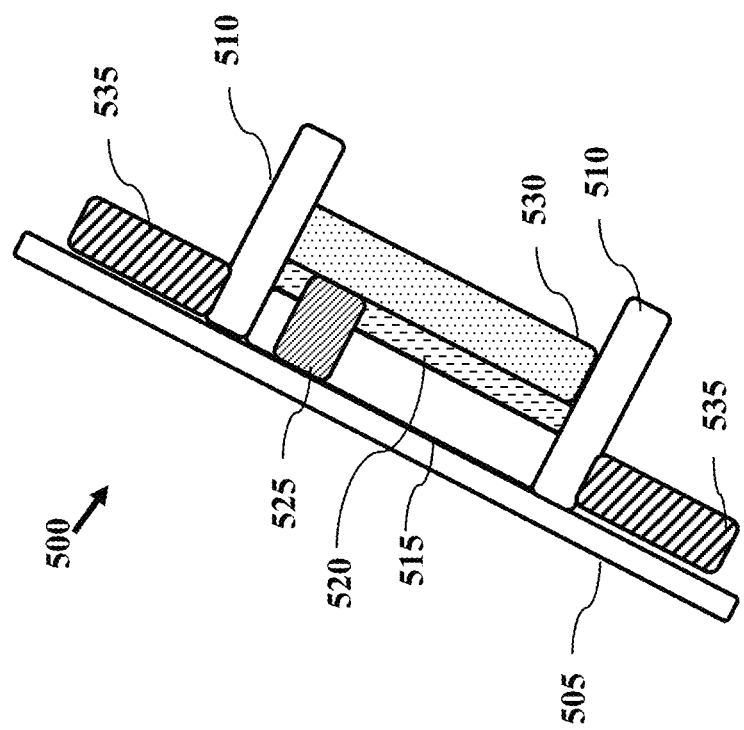
FIG. 5A depicts a graphical representation of a surface wrapped user interface touch control according to one or more embodiments.

FIGS. 5A-5B depict graphical representations of components of touch controls according to one or more embodiments. FIG. 5A depicts a graphical representation of a surface wrapped user interface touch control 500 according to one or more embodiments. According to one embodiment, touch controls as described herein may include one or more elements including a surface wrap to allow for the touch control assembly to be mounted to a main panel, the touch control assembly providing a surface.

According to one embodiment, touch control 500 includes wrapping material 505, housing assembly 510, surface 515, touch sensor 520, illumination element 525 and printed wiring board 530. Touch control 500 may be mounted to a main housing 535.

Housing assembly 510 supports surface 515, which may provide an outer surface for mounting wrapping material 505 and for providing a touch surface.

In one embodiment, touch sensor 520 is mounted to an inner surface of the housing assembly 510. Touch sensor 520 includes at least one touch zone and is configured to detect contact to outer surface 515 of the housing assembly associated with the at least one touch zone.

Touch control 500 includes at least one illumination element, such as illumination element 525, configured to illuminate a portion of outer surface 515 of the housing assembly 520 associated the input touch zone. Illumination element 525 may represent a light pipe through housing assembly outer surface 515 that allows one or more lighted elements to illuminate a portion of the wrapping.

Wrapping material 505 may be applied to the outer surface 515 and covers the touch control 500. At least a portion of wrapping material 505 is configured to be illuminated by the at least one illumination element. Wrapping material 505 allows for the outer surface 515 to be wrapped in a soft material like a polyurethane, leather, suede or fabric. The appearance of wrapping material 505 allows for the surface to appear uninterrupted and seamless. When prompted, wrapping material 505 and touch control 500 come to life with backlighting from illumination element 525. Wrapping material 505 may include subtle surface marking from embossed to laser marked icons. The configurations provide a solution for maintaining uninterrupted design while providing functional accessibility to common controls.

Printed wiring board 530 may include a controller coupled to touch sensor 520 and illumination element 525. The controller is configured to illuminate the at least one illumination element in response to contact with the at least one touch zone, and output a control signal in response to contact with the at least one touch zone.

Elements of FIG. 5A are shown in a flat configuration but may be configured in a curved arrangement similar to FIG. 4C or as in the assemblies shown in FIG. 5B.

FIG. 5B depicts a graphical representation of a surface wrapped user interface touch control configuration according to one or more embodiments. Touch control 550 includes two assemblies. Assembly 551 is mounted in a lower position and includes elements similar to touch control 500.

Assembly 551 may be bonded to main panel 535 which may be fiber glass, 3D printed material, molded plastic etc. Main panel 535 may relate to a console of a vehicle control interface. Assembly 551 includes housing assembly 510 which may be a sub-bezel supporting touch sensor 520.

Assembly 552 may be bonded to main panel 535 and include elements similar to touch control 500. According to one embodiment, the touch control of assembly 553 includes a sheet material 556 (e.g., acrylic sheet, etc.) that may be bonded to a touch sensor 557 and wrap material. Sheet material 556 may be a translucent material that is mounted to a sub-bezel to support the touch sensor. Sheet material 556 may be mounted to the main panel 535. According to one embodiment, wrapping material may cover assembly 551, assembly 552 and main panel 535.

While this disclosure has been particularly shown and described with references to exemplary embodiments thereof, it will be understood by those skilled in the art that various changes in form and details may be made therein without departing from the scope of the claimed embodiments.

What is claimed is:

1. A touch control device comprising:
   a housing assembly including an outer surface;
   a touch sensor mounted to an inner surface of the housing assembly, wherein the touch sensor includes at least one touch zone and wherein the touch sensor is configured to detect contact to the outer surface of the housing assembly associated with the at least one touch zone;
   at least one illumination element configured to illuminate a portion of the outer surface of the housing assembly associated with the at least one touch zone, wherein the illumination element includes a light pipe through the housing assembly outer surface to illuminate a portion of wrapping material;
   a wrapping material applied to the outer surface and covering the touch sensor, wherein the wrapping material is configured to be illuminated by way of the light pipe and the at least one illumination element, wherein the wrapping material comprises an uninterrupted and seamless surface adapted to permit illumination of the wrapping material via backlighting from the at least one illumination element; and
   a controller coupled to the touch sensor and the at least one illumination element, wherein the controller is configured to:
   illuminate the at least one illumination element in response to contact with the at least one touch zone, and
   output a control signal in response to contact with the at least one touch zone.

2. The touch control device of claim 1, wherein the outer surface is a flat surface.

3. The touch control device of claim 1, wherein the outer surface is a curved surface.

4. The touch control device of claim 1, wherein the housing assembly mounts to a main panel and the touch control device and main panel are wrapped in the material.

5. The touch control device of claim 1, wherein the touch sensor includes a plurality of touch zones.

6. The touch control device of claim 5, wherein the touch sensor includes at least one illumination element for each of the plurality of touch zones.

7. The touch control device of claim 1, wherein the illumination element includes at least one light source and at least one illumination area of the surface.

8. The touch control device of claim 1, wherein the controller is mounted to the housing assembly and is configured to output touch commands detected by the touch sensor.

9. The touch control device of claim 1, wherein the touch sensor includes a light tube for each touch zone, wherein the light tube is configured to be illuminated and controlled to present one or more colors by the controller.

10. A method for operation of a touch control, the method comprising:
    detecting, by a touch control, an input to at least one touch zone of the touch control, wherein the input includes contact to a wrapped surface of the touch control, wherein the touch control includes
    a housing assembly including an outer surface,
    a touch sensor mounted to an inner surface of the housing assembly, wherein the touch sensor includes at least one touch zone and wherein the touch sensor is configured to detect contact to the outer surface of the housing assembly associated with the at least one touch zone,
    at least one illumination element configured to illuminate a portion of the outer surface of the housing assembly associated with the at least one touch zone, wherein the illumination element includes a light pipe through the housing assembly outer surface to illuminate a portion of wrapping material, and
    a wrapping material applied to the outer surface and covering the touch sensor, wherein the wrapping material is configured to be illuminated by way of the light pipe and the at least one illumination element, wherein the wrapping material comprises an uninterrupted and seamless surface adapted to permit illumination of the wrapping material via backlighting from the at least one illumination element;
    controlling, by a controller of the touch control, illumination of at least one illumination element of the touch control in response to the input; and
    outputting, by a controller of the touch control, a control signal in response to contact with the at least one touch zone.

11. The method claim 10, further comprising illuminating at least one touch zone to signal the location of one or more touch zones of the touch control.

12. The method claim 10, further comprising updating at least one illumination parameters, wherein touch zones may be illuminated with a low light level which may be increased in response to a detected input.

13. A surface wrapped touch control device comprising:

a housing assembly supporting an outer surface for a touch control;

a touch sensor mounted to an inner surface of the housing assembly, wherein the touch sensor includes at least one touch zone and wherein the touch sensor is configured to detect contact to the outer surface of the housing assembly associated with the at least one touch zone;

at least one illumination element configured to illuminate a portion of the outer surface of the housing assembly associated the at least one touch zone, wherein the illumination element includes a light pipe through the housing assembly outer surface to illuminate a portion of wrapping material;

a wrapping material applied to the outer surface and covering the touch sensor, wherein the wrapping material is configured to be illuminated by the at least one illumination element, wherein the wrapping material comprises an uninterrupted and seamless surface adapted to permit illumination of the wrapping material via backlighting from the at least one illumination element; and a controller coupled to the touch sensor and the at least one illumination element, wherein the controller is configured to:

illuminate the at least one illumination element in response to contact with the at least one touch zone, and output a control signal in response to contact with the at least one touch zone.

14. The surface wrapped touch control device of claim 13, wherein the outer surface is at least one of a flat and curved surface covered by the wrapping material.

15. The surface wrapped touch control device of claim 13, wherein the housing assembly mounts to a main panel and the touch control device and main panel are wrapped in the material.

16. The surface wrapped touch control device of claim 13, wherein the touch sensor includes a plurality of touch zones.

17. The surface wrapped touch control device of claim 13, wherein the illumination element includes at least one light source and at least one illumination area of the surface.

18. The surface wrapped touch control device of claim 13, wherein the controller is mounted to the housing assembly and is configured to output touch commands detected by the touch sensor.

19. The surface wrapped touch control device of claim 13, wherein the touch sensor includes at least one illumination element for each of the plurality of touch zones.

20. The surface wrapped touch control device of claim 13, wherein the touch sensor includes a light tube for each touch zone, wherein the light tube is configured to be illuminated and controlled to present one or more colors by the controller.

* * * * *